(12) United States Patent  
Ratliff

(10) Patent No.: US 6,497,035 B1  
(45) Date of Patent: Dec. 24, 2002

(54) HALL POSITION SENSOR

(75) Inventor: William Edward Ratliff, Acton, CA (US)

(73) Assignee: HR Textron, Inc., Valencia, CA (US)

( * ) Notice: Subject to any disclaimer, the term of this patent is extended or adjusted under 35 U.S.C. 154(b) by 0 days.

(21) Appl. No.: 09/483,302

(22) Filed: Jan. 14, 2000

Related U.S. Application Data

(63) Continuation-in-part of application No. 09/455,036, filed on Dec. 6, 1999, now Pat. No. 6,300,739.

(51) Int. Cl.[7] .................. H02K 15/00; H02K 11/00; H05K 13/04; G01R 33/07; G01B 7/00
(52) U.S. Cl. .................. 29/596; 324/174; 324/207.2; 324/252; 29/854; 29/860; 174/117 F; 310/68 B; 310/71
(58) Field of Search .................. 324/117 H, 173, 324/174, 207.2, 207.21, 235, 251, 252; 307/116; 361/749, 760; 338/32 R, 32 H; 174/117 F, 117 FF, 254; 29/854, 857, 860, 596; 439/67, 77; 310/71, 68 B

(56) References Cited

U.S. PATENT DOCUMENTS

| | | | | |
|---|---|---|---|---|
| 4,265,549 A | * | 5/1981 | Cote ................... 361/749 X |
| 4,476,404 A | | 10/1984 | Bygdnes ................... 310/27 |
| 4,614,111 A | | 9/1986 | Wolff | |
| 4,928,089 A | * | 5/1990 | Gasiunas et al. .... 324/207.2 X |
| 4,952,830 A | | 8/1990 | Shirakawa | |
| 4,994,739 A | * | 2/1991 | Honda et al. ........... 324/251 X |
| 5,041,761 A | | 8/1991 | Wright et al. | |
| 5,093,617 A | * | 3/1992 | Murata ................ 324/207.2 X |
| 5,313,128 A | | 5/1994 | Robinson et al. ............. 310/71 |
| 5,369,361 A | * | 11/1994 | Wada ................... 324/207.2 |
| 5,450,054 A | * | 9/1995 | Schmersal ............ 338/32 R X |
| 5,493,159 A | | 2/1996 | Norris ........................ 310/71 |
| 5,508,611 A | * | 4/1996 | Schroeder et al. .. 324/207.21 X |
| 5,523,681 A | * | 6/1996 | Hajzler ....................... 324/174 |
| 5,631,557 A | * | 5/1997 | Davidson ................... 324/174 |
| 5,644,230 A | * | 7/1997 | Pant et al. .......... 324/207.2 X |
| 5,675,195 A | * | 10/1997 | Takei ..................... 174/254 X |
| 5,871,493 A | | 2/1999 | Sjostrom et al. | |
| 6,169,254 B1 | * | 2/2001 | Pant et al. .................. 174/254 |
| 6,324,745 B1 | | 12/2001 | Poag et al. | |

* cited by examiner

Primary Examiner—Gerard R. Strecker  
(74) Attorney, Agent, or Firm—Fulbright & Jaworski L.L.P.

(57) ABSTRACT

An improved Hall position sensor comprises a Hall effect sensing device having its leads soldered directly to an exposed electro-conductive portion of a flexible multiconductor circuit. The Hall position sensor further comprises a Hall magnet disposed proximate to the soldered Hall effect sensing device/flexible circuit unit.

5 Claims, 9 Drawing Sheets

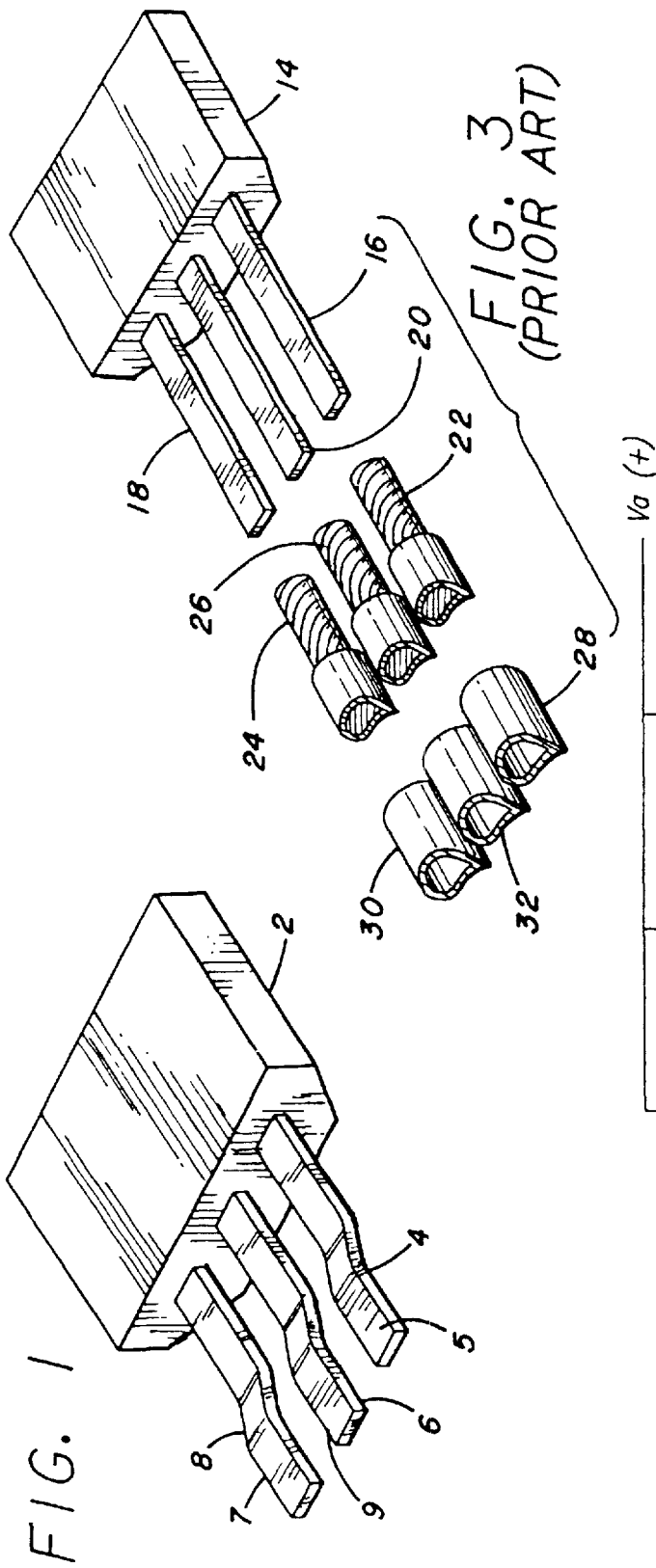
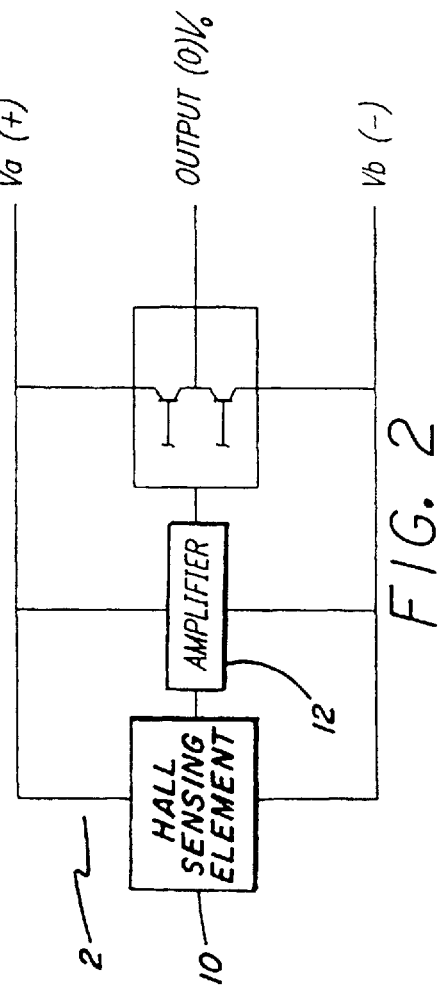

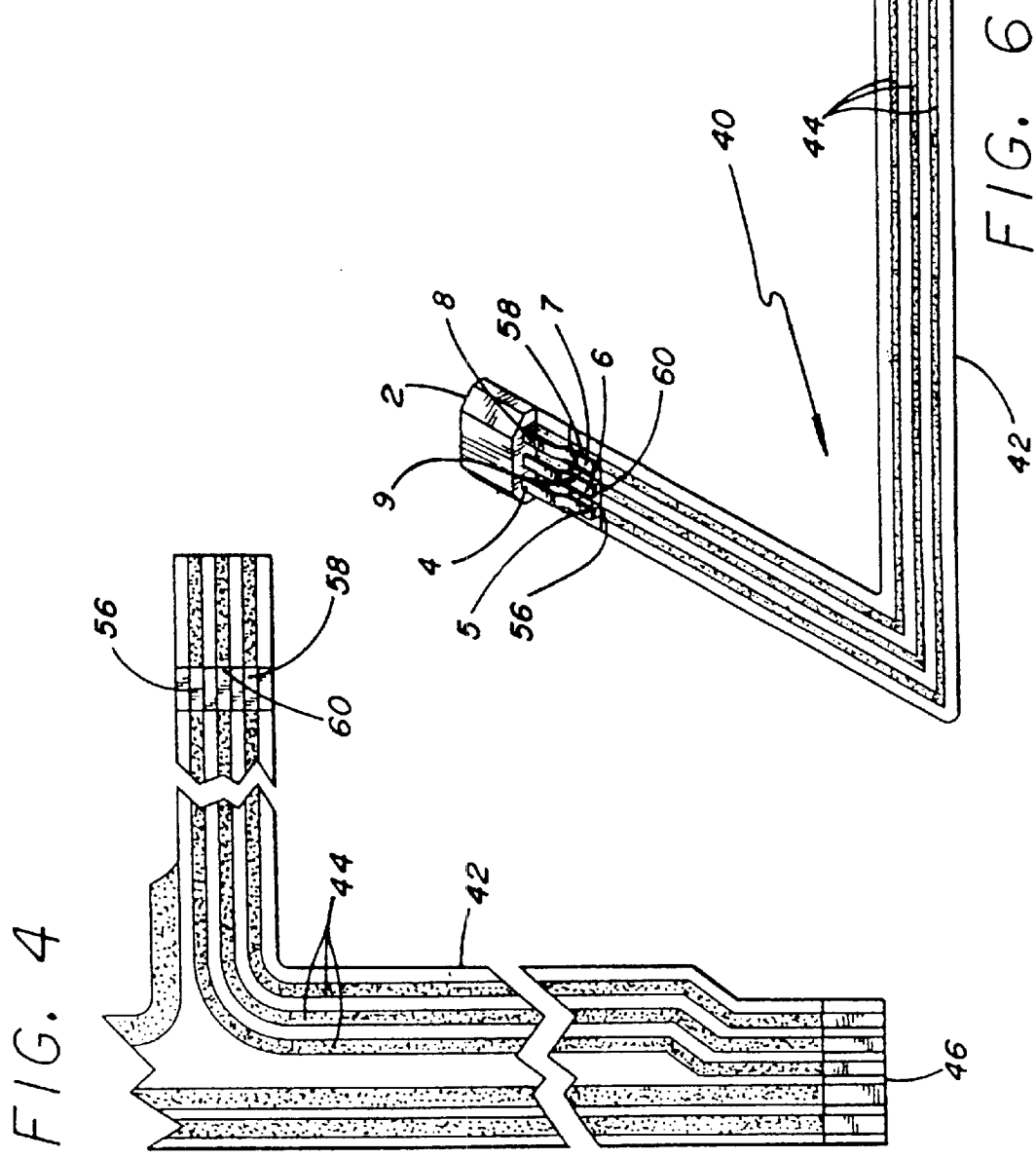

HALL POSITION SENSOR

RELATED APPLICATIONS

This application is a continuation-in-part of U.S. patent application Ser. No. 09/455,036, filed on Dec. 6, 1999, now U.S. Pat. No. 6,300,739, entitled "Low Cost Limited Angle Torque DC Brushless Servomotor And Method For Fabricating Thereof", having common inventor and assignee, the contents of which copending application is incorporated herein by reference.

BACKGROUND OF THE INVENTION

1. Field of the Invention

The present invention relates generally to position sensors and more particularly to a Hall position sensor of the type having a permanent Hall magnet and an analog/digital Hall effect sensing device disposed proximate to the Hall magnet, the Hall position sensor being powered by and sending feedback to an external controller.

2. Prior Art

Hall position sensors are usually deployed as an integral part of closed loop feedback control systems which are used in a variety of fields such as automotive vehicle component testing and manufacturing, semiconductor manufacturing, industrial automation and robotics and the like. A Hall position sensor of this type comprises a Hall magnet (or magnets) disposed in close proximity to an analog or digital Hall effect sensing device which has two input leads for receiving power from an external controller circuit board and one output lead for sending position feedback signal information to the controller. The Hall effect sensing device leads can be surface mounted (soldered) directly to the controller circuit board or when the Hall effect sensing device has to be positioned away from the controller due to packaging problems, the leads are traditionally soldered to wire connectors which connect on the other end to the controller via a special connector or are surface mounted to the board. Using traditional wire connectors is functional but inefficient from a manufacturing point of view as the connection set up involves providing two separate labor intensive physical connections between the Hall effect sensing device and the controller. Also, surface mounting a Hall effect sensing device to the controller circuit board is not always desirable due to possible electromagnetic interference (EMI) from the moving Hall magnet which may interfere with the normal functioning of the controller.

In most applications, the Hall sensing device is usually stationary while the Hall magnet(s) is/are in motion. However, there are certain applications in which it is desirable to have the Hall effect sensing device in motion while the proximate Hall magnet(s) is/are stationary during operation. A moving Hall effect sensing device requires reliable electrical connection to the controller especially in high frequency and/or high cycling applications which cannot be fully achieved with traditional methods which utilize spiral cords or cables with retainer means and the like which are subject to continuous wear and tear during operation. Unreliable electrical connection leads to increased maintenance and troubleshooting costs which is an obvious disadvantage for the cost-conscious manufacturer.

Therefore the need arises for an improved low cost Hall position sensor which is preferably made of inexpensive yet reliable components, is easy to assemble in a matter of seconds and which can provide reliable performance thereby presenting a viable cost-efficient solution for manufacturers. Such an improved Hall position sensor should eliminate the usual wear and tear associated with traditional connections between the Hall effect sensing device and the controller so as to significantly reduce maintenance costs and extend the life of the device in which the Hall position sensor is integrated.

SUMMARY OF THE INVENTION

The present invention is directed to an improved Hall position sensor for integrating into a support structure adapted for receiving the same, the Hall position sensor having at least one Hall magnet and communicating with a controller, the improvement comprising at least one Hall effect sensing device disposed proximate to the at least one Hall magnet; and at least one circuit for electrically coupling the at least one Hall effect sensing device to the controller, the at least one circuit having at least one flexible portion for reducing the cost of integrating the Hall position sensor in the support structure.

In accordance with one aspect of the present invention, the at least one circuit is a substantially flexible circuit, the substantially flexible circuit comprising a plurality of flexible electrical conductors embedded between sheets of flexible insulating material. The substantially flexible circuit further comprises first end portion and second end portion, each of the first and second end portions having exposed electrical conductors.

In accordance with another aspect of the present invention, the improved Hall position sensor further comprises means for electrically coupling the first exposed electro-conductive end portion of the substantially flexible circuit to the controller. The coupling means includes a flexible circuit connector on the controller for mating with the first exposed electro-conductive end portion of the substantially flexible circuit.

In accordance with yet another aspect of the present invention, the improved Hall position sensor further comprises means for electrically coupling the second exposed electro-conductive end portion of the substantially flexible circuit to the at least one Hall effect sensing device. The coupling means includes a plurality of electro-conductive leads on the at least one Hall effect sensing device for soldering directly to the second exposed electro-conductive end portion of the substantially flexible circuit.

In accordance with a different aspect of the present invention, a method for reducing the cost of integrating a Hall position sensor into a support structure adapted for receiving the same is disclosed. The Hall position sensor has at least one Hall magnet with the method comprising the steps of providing at least one low cost surface mount Hall effect sensing device with a plurality of electro-conductive leads; disposing the at least one surface mount Hall effect sensing device proximate to the at least one Hall magnet; providing a low cost flexible multiconductor circuit having first end portion and second end portion, each of the first and second end portions having exposed electrical conductors; providing a controller with a flexible circuit connector for mating with the first exposed electro-conductive end portion of the flexible circuit; plugging the first exposed electro-conductive end portion of the flexible circuit in the flexible circuit connector of the controller; and soldering the electro-conductive leads of the at least one surface mount Hall effect sensing device directly to the second exposed electro-conductive end portion of the flexible circuit.

In accordance with a still different aspect of the present invention, a method for reducing the cost of integrating a Hall position sensor into a support structure adapted for receiving the same is disclosed. The Hall position sensor has at least one Hall magnet with the method comprising the steps of providing at least one low cost through hole Hall effect sensing device with a plurality of electro-conductive leads; disposing the at least one through hole Hall effect sensing device proximate to the at least one Hall magnet; providing a low cost flexible multiconductor circuit having first end portion and second end portion, each of the first and second end portions having exposed electrical conductors; providing a controller with a flexible circuit connector for mating with the first exposed electro-conductive end portion of the flexible circuit; plugging the first exposed electro-conductive end portion of the flexible circuit in the flexible circuit connector of the controller; adjusting the length of the electro-conductive leads of the at least one through hole Hall effect sensing device to a length matching the width of the second exposed electro-conductive end portion of the flexible circuit; and soldering the adjusted electro-conductive leads of the at least one through hole Hall effect sensing device directly to the second exposed electro-conductive end portion of the flexible circuit.

These and other aspects of the present invention will become apparent from a review of the accompanying drawings and the following detailed description of the invention.

BRIEF DESCRIPTION OF THE DRAWINGS

FIG. 1 is a perspective view of a conventional surface mount Hall effect sensing device for use in accordance with the present invention;

FIG. 2 is a circuit diagram of the Hall effect sensing device of FIG. 1;

FIG. 3 is a perspective view of a standard through hole Hall effect sensing device being fitted conventionally with wire connectors for connecting to a controller;

FIG. 4 is a plan view of a flexible circuit for use in accordance with the present invention;

FIG. 6 is a perspective view of a Hall position sensor fabricated in accordance with the present invention;

DETAILED DESCRIPTION OF THE PREFERRED EMBODIMENTS

Figure 5:
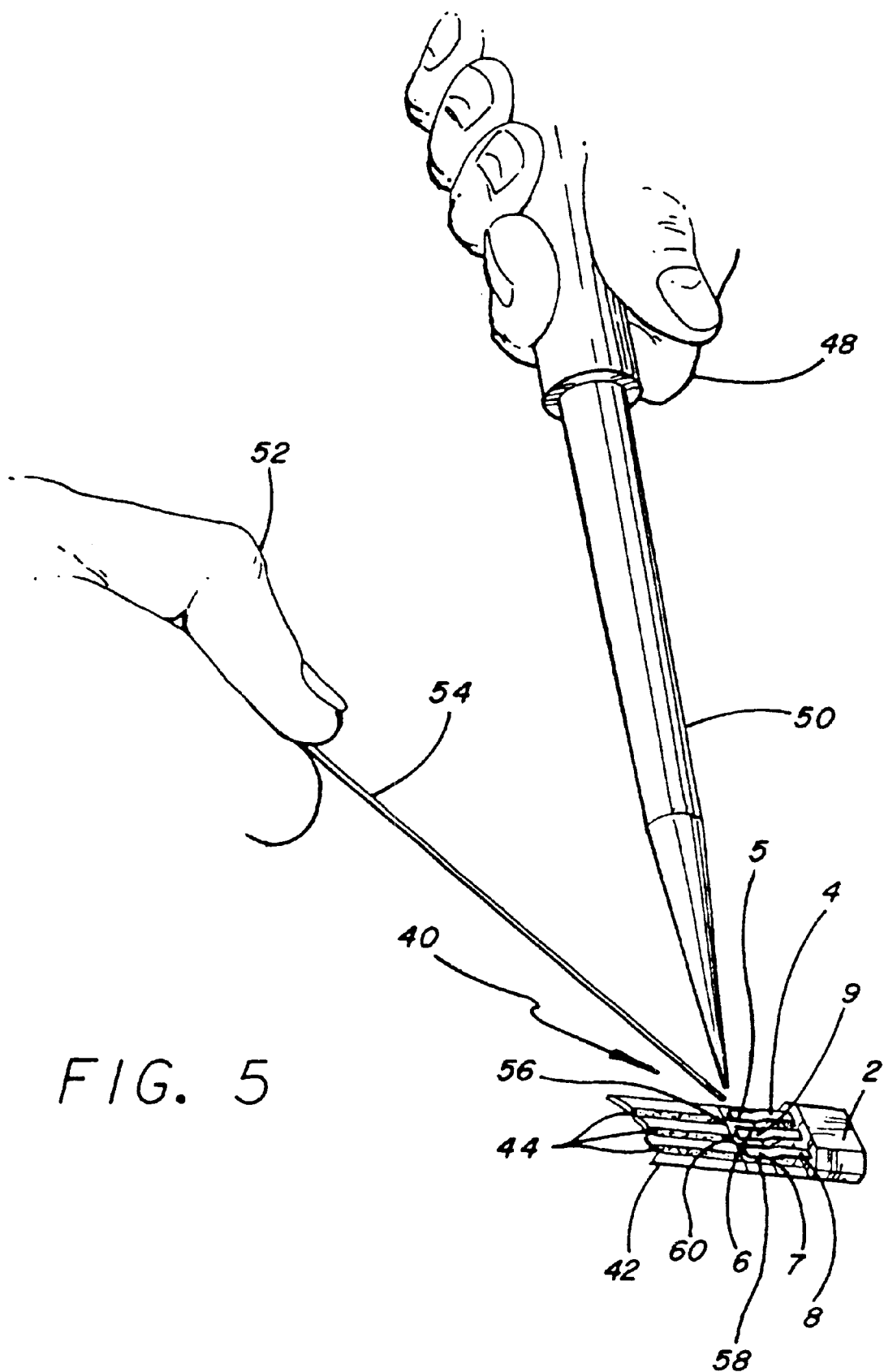
FIG. 5 is a perspective view of the Hall effect sensing device of FIG. 1 being soldered to one end of the flexible circuit of FIG. 4 in accordance with the present invention.

Hereinafter, some preferred embodiments of the present invention will be described in detail with reference to the related drawings of FIGS. 1–12. Additional embodiments, features and/or advantages of the invention will become apparent from the ensuing description or may be learned by the practice of the invention.

The following description includes the best mode presently contemplated for carrying out the invention. This description is not to be taken in a limiting sense, but is made merely for the purpose of describing the general principles of the invention.

The present invention refers to an improved low cost Hall position sensor which comprises a standard inexpensive surface mount Hall effect sensing device having its three leads soldered directly to an exposed multi-conductor end portion of an electrically conductive flexible circuit. The flexible circuit may be custom designed and manufactured at low cost for a variety of mass production applications. The position sensor also includes a permanent Hall magnet which usually moves during operation and is disposed proximate to the soldered Hall effect sensing device which in this case would be stationary during operation. The Hall effect sensing device picks up variations in the magnetic flux generated by the movement of the Hall magnet and sends a corresponding feedback voltage signal to an external controller circuit board which also powers the Hall effect sensing device via the flexible circuit. The flexible circuit is adapted on one end for removably mating with a corresponding connector located on the controller circuit board. The inventive Hall position sensor provides a reliable and low cost alternative to manufacturers incorporating Hall position sensors in their products and may be utilized in a variety of industrial applications such as in servomotors, flow rate sensors, remote reading sensors, door interlock and ignition sensors and the like.

The novel sensor may also be utilized for position sensing in applications which involve a linear actuator (hydraulic or pneumatic cylinder having a piston rod) attached to a servovalve. The servovalve controls fluid flow to the two ends of the cylinder causing the piston rod to move in or out respectively. In this case, the Hall effect sensing device, after being soldered directly to one end of an appropriately configured flexible circuit, may be affixed to the piston rod proximate to a stationary elongated magnetic strip so that the Hall effect sensing device moves with the rod relative to the magnetic strip during operation. Such a set up would eliminate the usual wear and tear on conventional wire connectors which are typically used in this type of application thereby reducing maintenance costs and extending the life of the actuator.

Referring now more particularly to FIG. 1, a standard surface mount Hall effect sensing device 2 is shown having leads 4, 6 and 8 for soldering the same usually directly to a controller circuit board (not shown) via its downwardly (toward the circuit board) curved end portions 5, 7 and 9. End portions 5, 7 and 9 are conventionally curved downwards to allow Hall effect sensing device 2 to be surface mounted flush on the circuit board. A Hall effect sensing device of this type has a retail price of about $3.00 and may be purchased from electronics stores throughout the country. As shown in FIG. 2, Hall effect sensing device 2 includes internally a conventional Hall sensing element 10, an amplifier 12 and additional circuitry providing two inputs, $V_a$ and $V_b$, and one output $V_o$ (controller feedback) corresponding to leads 4, 8 and 6, respectively.

Whenever packaging problems arise during integration of a Hall effect sensing device in an assembly or housing, the prior art handles such problems (as shown in FIG. 3) by soldering the leads of the Hall effect sensing device directly to long wire connectors which can be removably or surface mounted on the controller circuit board. Packaging problems arise when it is not possible due to design constraints to place a controller circuit board with a mounted Hall effect sensing device (surface mount or through hole Hall effect sensing device) close enough to the permanent Hall magnet to permit accurate operation of the same. Specifically, FIG. 3 illustrates a Hall effect sensing device 14 (of the through hole type) having generally straight leads 16, 18 and 20 about to be connected (soldered) to the exposed copper portions of wire connectors 22, 24 and 26, respectively. After soldering, a relatively short piece of insulation tubing 28, 30 and 32 made of plastic or the like is conventionally fitted over each soldered connection. The other end of each wire connector (not shown) is fitted with a special connector for mating with a corresponding counterpart connector located on the controller circuit board or may be surface mounted (soldered) directly on the circuit board. This type of connection, although functional for any application involving a stationary Hall effect sensing device, is time consuming and relatively costly (labor intensive) from a manufacturing point of view especially in mass production. Furthermore, this type of connection is typically avoided by manufacturers in applications involving a moving Hall effect sensing device relative to stationary Hall magnet(s) due to the continuous and undesirable wear and tear on traditional connectors used in dynamic applications.

The present invention solves the above problems, as depicted in FIGS. 4–6, by introducing a novel Hall position sensor which is described hereinbelow and generally referred to by reference numeral 40. Hall position sensor 40 preferably includes at least one conventional surface mount Hall effect sensing device such as Hall effect sensing device 2 (from FIG. 1) which is soldered without modifying the same (Hall effect sensing device 2), in accordance with the best mode for practicing the invention, via the downwardly curved end portions of its leads such as end portions 5, 7 and 9 of leads 4, 6 and 8 of Hall effect sensing device 2 directly to a portion of a flexible circuit 42 having exposed copper conductors. The number of Hall effect sensing devices used depends on a particular application as described hereinbelow with reference to FIGS. 7–12. Flexible circuit 42 is a standard multiconductor flexible circuit (FIGS. 4–6) containing rows of flexible copper conductors or traces 44 embedded between sheets of flexible insulating plastic. As shown in FIGS. 4, 6, flexible circuit 42 may be removably connected to an external controller circuit board (not shown) via end portion 46 which is stiffened on one side with extra plastic material (not shown) with the other side comprising adjacent bands of exposed copper conductors each covered typically with a relatively thin layer of standard lead-tin solder alloy for mating with a counterpart flexible circuit connector provided on the controller circuit board (not shown). Alternatively, end portion 46 may be soldered directly to a controller circuit board if needed.

A manual soldering process is illustrated in FIG. 5 which shows an operator hand 48 holding a soldering iron 50 and an operator hand 52 holding a solder rod 54 with end portions 5, 7 and 9 about to be soldered directly to corresponding exposed copper conductors 56, 58 and 60 of flexible circuit 42 so that Hall effect sensing device 2 can be surface mounted flush on the flexible circuit 42. The exposed copper conductors are typically covered with a relatively thin layer of standard lead-tin solder alloy. The preferred type of solder used in the inventive method is a standard Sn63 solder with soldering temperature typically about 600 degrees Fahrenheit. Other types of solder may be used provided such other types of solder do not deviate from the intended purpose of the present invention. The length of an exposed copper conductor trace should preferably coincide with the length of a downwardly curved end portion of a surface mount Hall effect sensing device lead to allow flush surface mounting of the same on the flexible circuit.

It should be appreciated by a person skilled in the art that manual soldering is not the only option for attaching a surface mount Hall effect sensing device to a flexible circuit as the soldering process may be easily automated for mass production applications. For example, tooling fixtures may be provided to hold the Hall effect sensing device and flex circuit together during soldering in addition to any other suitable adaptations needed to practice the present invention.

Furthermore, the location of the flexible circuit area containing exposed copper conductors 56, 58 and 60, although shown inset in FIGS. 4–6, may be moved to any portion of flexible circuit 42 including its other end portion, if so desired. Flexible circuits of this kind may be custom designed and manufactured at low cost for mass production in any shape and/or form desired depending on the particular application from a number of flexible circuit manufacturers in the United States such as World Circuit Technology, Inc. of Simi Valley, Calif. and/or abroad.

Moreover, in accordance with the general principles for practicing the present invention, another type of standard Hall effect sensing device such as through hole Hall effect sensing device 14 (FIG. 3), which typically has longer leads (about 0.500 inch) compared to the leads of a standard surface mount Hall effect sensing device (which are about 0.125 inch), may be easily modified for use in the inventive Hall position sensor. The modification involves simply cutting down leads 16, 18 and 20 to about the same length as leads 4, 6 and 8 of Hall effect sensing device 2. The next step is soldering modified leads 16, 18 and 20 directly to an exposed copper conductor trace area of a flexible circuit of the type described above. Generally, in this case the exposed copper trace area should be located at one end of the flexible circuit (but not inset) since bending modified leads 16, 18 and 20 to assume the general shape of leads 4, 6 and 8 is not recommended.

It should also be appreciated by a person skilled in the art that the above-described novel Hall position sensor can employ standard analog or digital surface mount or through hole Hall effect sensing devices depending on the desired application.

Hall position sensor 40 also preferably includes at least one standard permanent Hall magnet (FIGS. 7–12) for placement generally proximate to surface mount Hall effect sensing device 2 so as to allow accurate position sensing during operation. The number of Hall magnets used depends on a particular application as described hereinbelow with reference to FIGS. 7–12. FIGS. 7–12 depict various Hall magnet configurations in a series of application examples which illustrate the wide applicability of the novel Hall position sensor.

EXAMPLE 1

Figure 7:
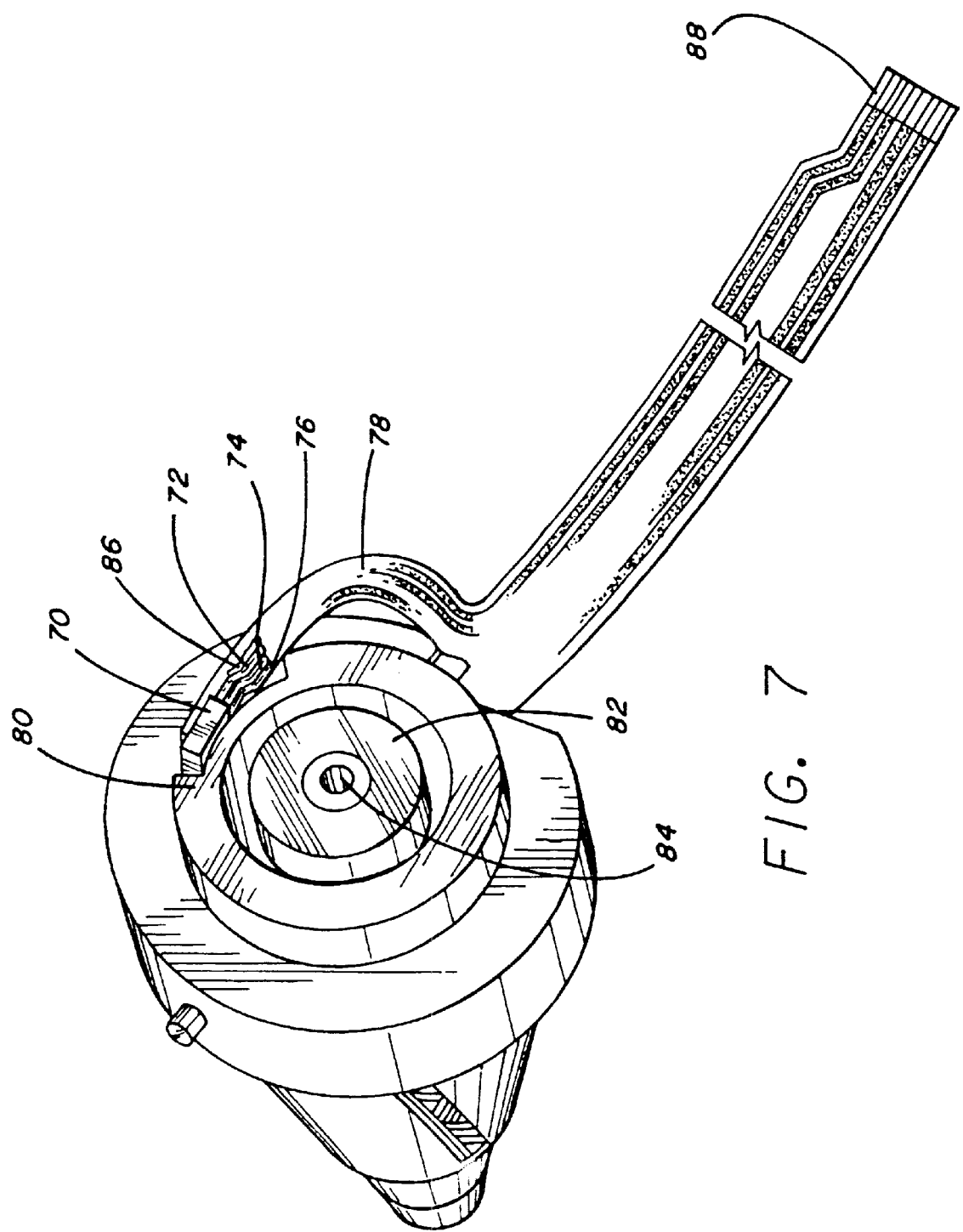
FIG. 7 is a perspective view of a Hall position sensor fabricated in accordance with the present invention as used in a DC motor application.

The inventive Hall position sensor may be used for rotor shaft position sensing in a DC motor as shown in FIG. 7. Specifically, a standard surface mount analog Hall effect sensing device 70 having leads 72, 74 and 76 soldered via its corresponding curved portions to an exposed copper conductor area 86 of a low cost custom-designed flexible circuit 78 is adhesively fixed to a bearing assembly 80 in proximity to a ring-shaped permanent Hall magnet 82. Typical cost for a flexible circuit of this type when mass produced is about $0.90 and may be purchased, for example from World Circuit Technology, Inc. of Simi Valley, Calif. The curved portions of leads 72, 74 and 76 in this case should point up towards the underside of flexible circuit 78 to allow flush surface mounting of Hall effect sensing device 70 to flexible circuit 78. Hall magnet 82 is fixed to a motor shaft 84 and moves with the same while bearing assembly 80 and Hall effect sensing device 70 remain stationary during motor operation. Flexible circuit 78 is provided at one end with an exposed copper conductor trace area 88 which is stiffened on the back with extra plastic material (as described above) for mating with a corresponding flexible circuit connector provided on an external controller circuit board (not shown). This set up allows the controller board to be placed away from the Hall effect sensing device to meet pertinent design packaging constraints. This is an important consideration in view of possible EMI associated problems that may arise if the Hall effect sensing device was directly soldered to the controller circuit board and the circuit board was placed in proximity to the Hall magnet (assuming for a moment that packaging the board near the Hall magnet was not an issue). As the Hall magnet moves during operation of the motor, various electronic components on the controller circuit board will be exposed to continuously varying magnetic flux generated by the Hall magnet which may result in a malfunctioning controller.

Integrating the novel Hall position sensor in this set up provides manufacturers with a reliable low cost motor shaft Hall position sensing capability and greatly facilitates troubleshooting as the controller and Hall effect sensing device can be separately tested in case of malfunction. If it is determined that the controller board is causing the malfunction, end 88 of flexible circuit 78 is unplugged, the malfunctioning controller is replaced and end 88 is then plugged back into the flexible circuit connector on the new controller circuit board efficiently restoring function to the motor.

EXAMPLE 2

Figure 8:
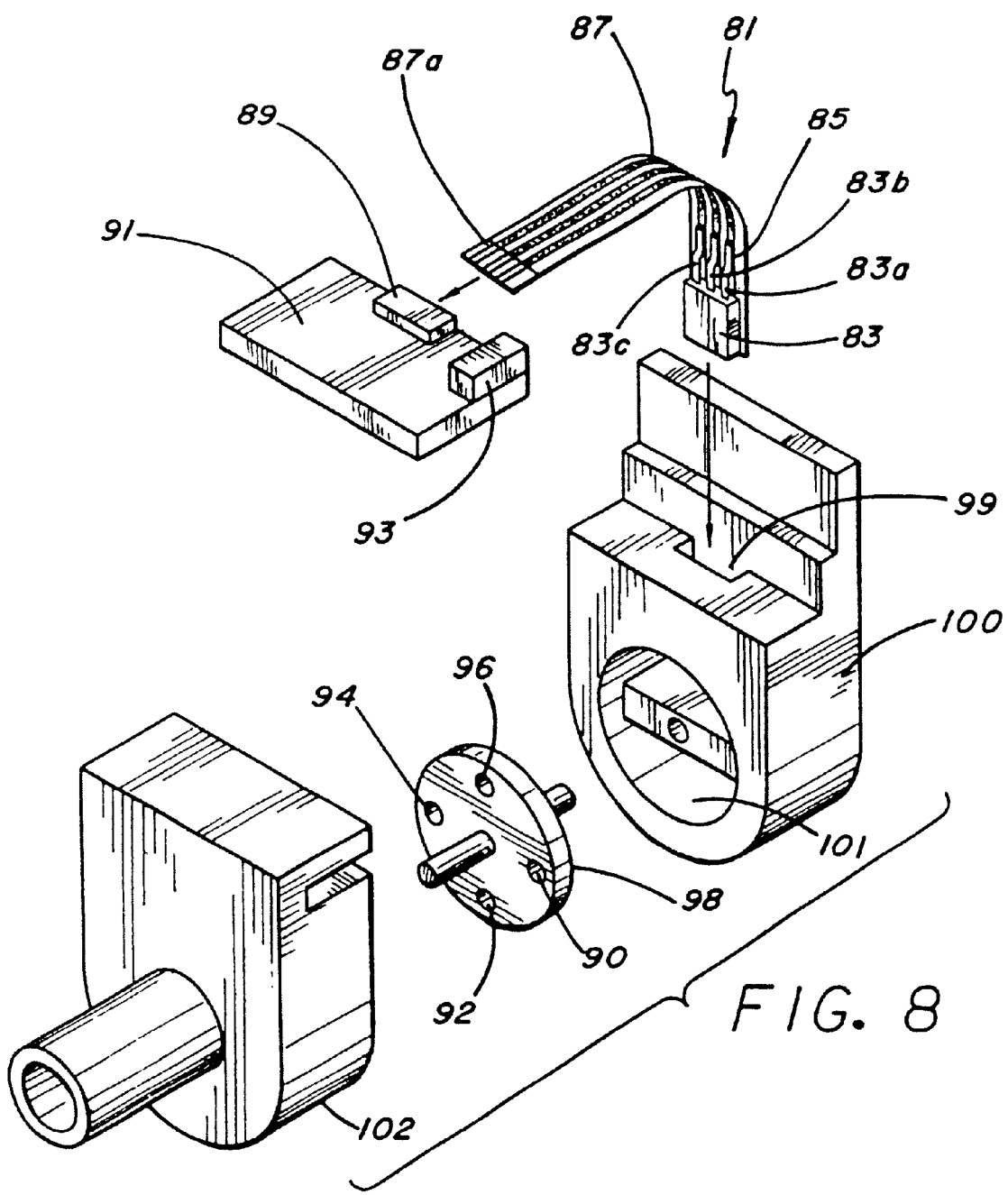
FIG. 8 is a perspective view of a Hall position sensor fabricated in accordance with the present invention as used in a flow rate sensor application.

The Hall position sensor of the present invention may also be used as a flow rate sensor as shown in FIG. 8. In this set up a Hall position sensor 81 comprises preferably a standard inexpensive digital surface mount Hall effect sensing device 83 soldered via leads 83*a*, 83*b* and 83*c* in the manner described above directly to the underside exposed copper trace area 85 of a low cost flexible circuit 87. Copper trace area 85 is disposed at one end of flexible circuit 87 as shown in FIG. 8. Flexible circuit 87 connects on the other end via exposed copper trace area 87*a* to a flexible circuit connector 89 on a controller (signal conditioning) circuit board 91. Controller board 91 also includes a standard input/output connector 93 (FIG. 8). Hall position sensor 81 also comprises four permanent Hall magnets 90, 92, 94 and 96 mounted symmetrically on a circular impeller 98 for measuring fluid flow. Each actuation of Hall effect sensing device 83 by one of the moving magnets (90, 92, 94 or 96) corresponds to a measured quantity of fluid. Impeller 98 is turned by the fluid flow with Hall effect sensing device 83 producing two outputs per revolution. The soldered Hall effect sensing device 83 preferably fits in a pocket 99 which is part of a housing 100. Impeller 98 is also fitted in an opening 101 inside housing 100. The assembly is then covered with a cover 102. An obvious advantage here is that controller board 91 may be of any size or shape desired and can be disposed away from housing 100 while Hall effect sensing device 83 is kept in proximity to magnets 90, 92, 94, 96 allowing accurate, reliable and low cost fluid flow sensing. Again, if the controller ever malfunctions, end 87*a* of flexible circuit 87 is unplugged, the old controller is replaced and end 87*a* is plugged back into the flexible circuit connector on the new controller circuit board quickly restoring function.

EXAMPLE 3

Figure 9:
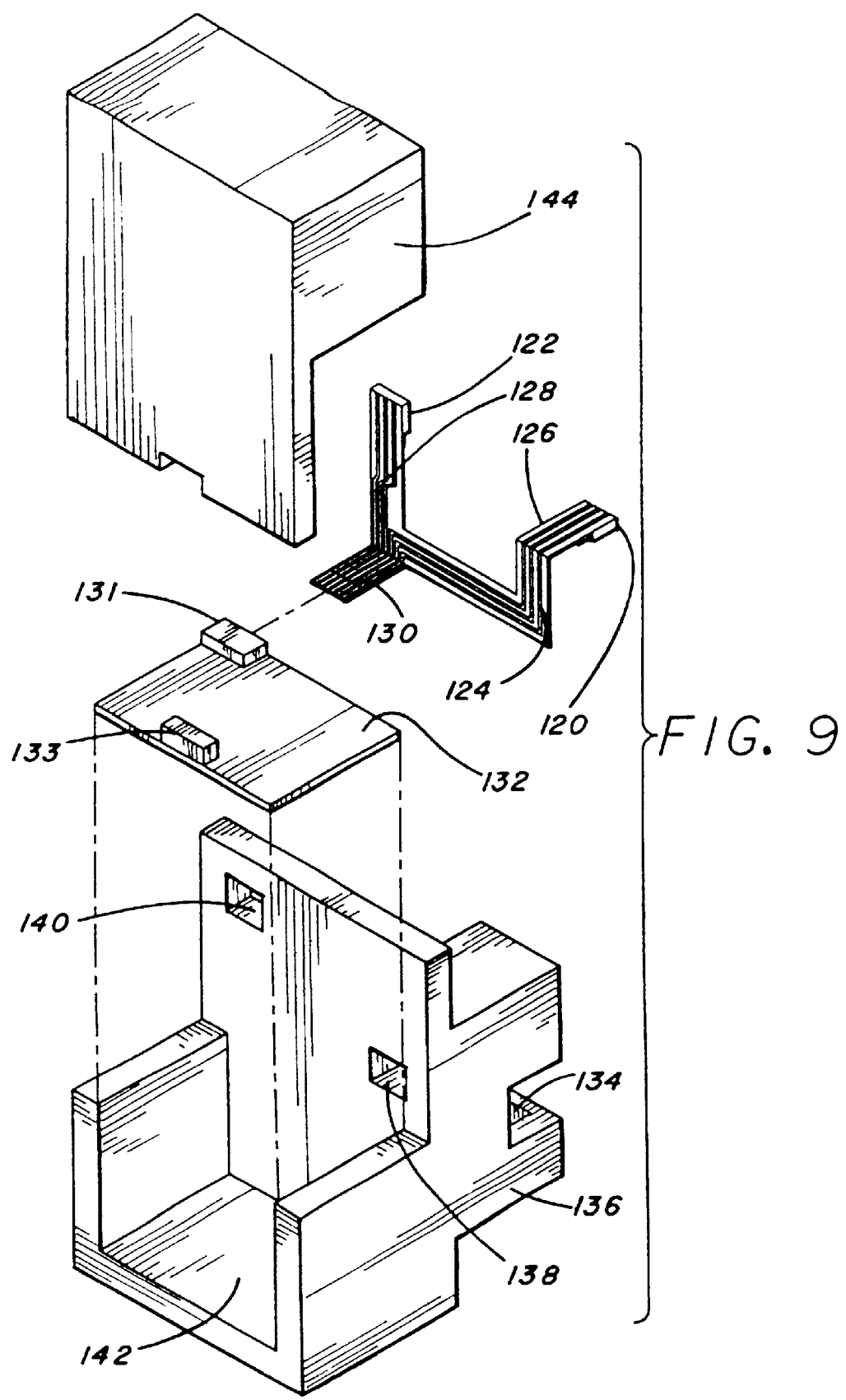
FIG. 9 is a perspective view of a Hall position sensor fabricated in accordance with the present invention as used in a remote reading sensor application.

The inventive Hall position sensor may be used as a remote reading sensor as shown in FIG. 9. The novel Hall position sensor in this case employs preferably two standard inexpensive digital surface mount Hall effect sensing devices 120, 122 each soldered via corresponding leads (not shown) in the manner described above directly to a corresponding underside exposed copper trace area of a low cost flexible circuit 124. Flexible circuit 124 includes three multiconductor arms 126, 128 and 130 whereby arms 126 and 128 contain the soldered Hall effect sensing devices 120 and 122 at their respective ends, while arm 130 includes a stiffened end having exposed copper conductors on one side for mating with a flexible circuit connector 131 provided on a controller (signal conditioning) circuit board 132 which also includes an input/output connector 133. The novel Hall position sensor also includes a ring Hall magnet (not shown) disposed proximate to soldered Hall effect sensing device 122 and a vane magnet 134 mounted in a housing 136 for interacting with soldered Hall effect sensing device 120. Soldered Hall effect sensing devices 120 and 122 fit into pockets 138 and 140, respectively, which are part of housing 136. Pocket 138 is located close to vane magnet 134 to allow accurate sensing during operation. Signal conditioning board 132 is also fitted into recess 142 in housing 136 with the assembly covered by a cover 144. Such a remote reading sensor may be used in self service gas stations, utility meters and the like to provide reliable and efficient remote reading sensor capability. Controller board 132 may be easily replaced if the need arises without replacing the integrated Hall position sensor.

EXAMPLE 4

Figure 10:
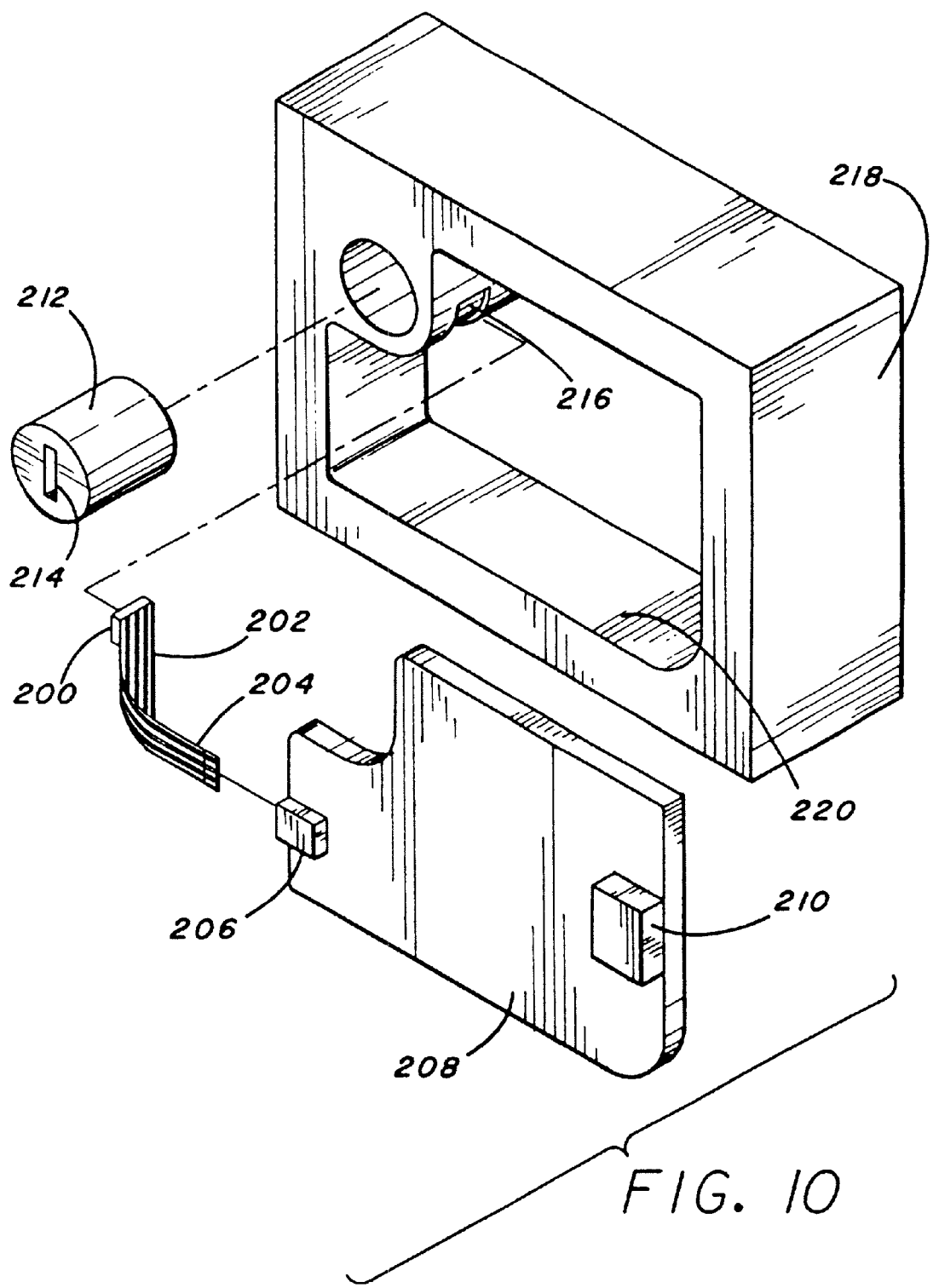
FIG. 10 is a perspective view of a Hall position sensor fabricated in accordance with the present invention as used in a door interlock and ignition sensor application.

The novel Hall position sensor may be employed as a door interlock and ignition sensor as shown in FIG. 10. The novel Hall position sensor comprises preferably a standard inexpensive digital surface mount Hall effect sensing device 200 soldered via corresponding leads (not shown) in the manner described above directly to a corresponding underside exposed copper trace area of a flexible circuit 202. Flexible circuit 202 includes a stiffened end 204 having exposed copper conductors on one side for mating with a flexible circuit connector 206 provided on a controller (signal conditioning) circuit board 208 which also includes an input/output connector 210. The novel Hall position sensor also includes a portion of a generally ring-shaped Hall magnet (not shown) which is mounted internally into a key cylinder 212 along the edge of cylinder 212 behind a key hole 214. Soldered Hall effect sensing device 200 is fitted into a pocket 216 which is part of a housing 218. Signal conditioning board 208 is respectively accommodated in a recess 220 which is also part of housing 218. Pocket 216 containing soldered Hall effect sensing device 200 is located proximate to the key cylinder Hall magnet to allow accurate key position sensing by soldered Hall effect sensing device 200 which picks up variations in the magnetic flux generated by movement of the ring-shaped Hall magnet which rotates when a key is turned in the door lock. This set up may provide a reliable and low cost electrical interlock for the ignition system of a vehicle. Signal conditioning board 208 can be easily replaced if the need arises without replacing the integrated Hall position sensor.

EXAMPLE 5

Figure 11:
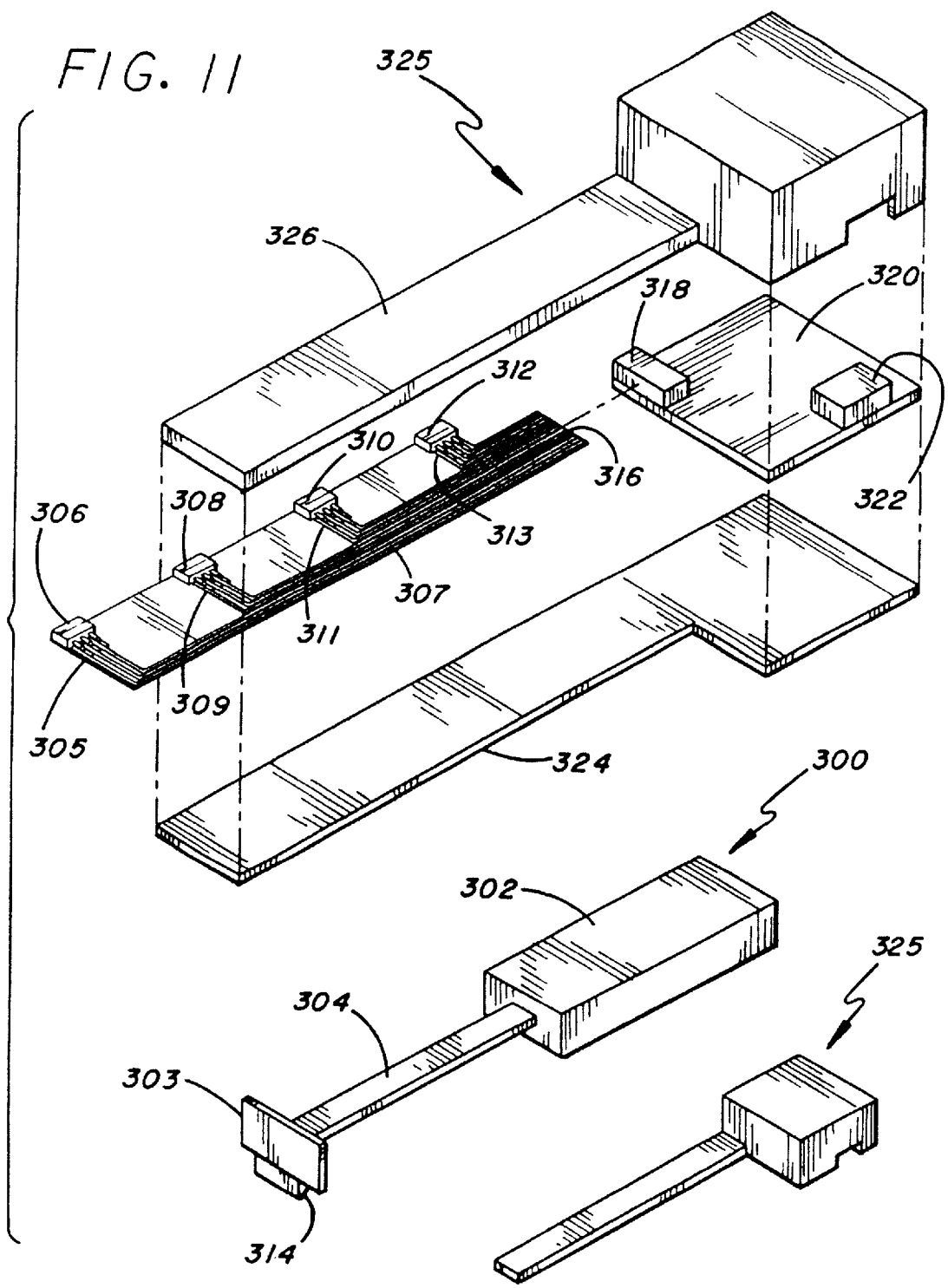
FIG. 11 is a perspective view of a multi-Hall position sensor package fabricated in accordance with the present invention as used in a linear actuator/servovalve sensor application.

FIG. 11 shows the Hall position sensor of the present invention being used for position sensing in an application involving a linear actuator 300. Linear actuator 300 typically comprises a hydraulic or pneumatic cylinder 302 attached to a servovalve (not shown), cylinder 302 having a piston rod 304. The servovalve controls fluid flow to each end of the cylinder causing piston rod 304 to move in or out respectively. In this case, the novel Hall position sensor comprises preferably a stationary elongated piece of flexible circuit 307 having four soldered analog surface mount Hall effect sensing devices 306, 308, 310 and 312 spaced at preselected regular intervals from one another as shown in FIG. 11 to allow accurate sensing of variations in the magnetic flux generated by a moving permanent Hall magnet 314. Hall magnet 314 is moving during operation of the actuator since it is typically affixed to the free end 303 of piston rod 304 (FIG. 11). Analog Hall effect sensing devices 306, 308, 310 and 312 are soldered via corresponding leads (not shown) in the manner described above directly to corresponding flexible circuit exposed copper trace areas 305, 309, 311 and 313, respectively, which are preferably located close to the outer edge (facing the piston rod) of flexible circuit 307. Flexible circuit 307 also includes a stiffened end 316 having exposed copper conductors on one side for mating with a flexible circuit connector 318 provided on a signal conditioning circuit board 320 which also includes a conventional input/output connector 322. After connecting end 316 to flexible circuit connector 318, the soldered multi-Hall effect sensing device package is housed in a housing 325 comprising a bottom portion 324 and a top portion 326. The housing containing the multi-Hall package is then placed proximate and parallel to piston rod 304 to permit accurate position sensing of the same during operation. This set up represents a significant improvement over prior art linear actuator position sensing which typically employs a linear potentiometer of about the same length as the cylinder stroke. The potentiometer uses a contact brush which is subject to wear and tear and needs replacement from time to time which keeps maintenance costs relatively high. Another prior art method is to use a series of regularly spaced digital Hall effect sensing devices as a proximity switch. In this method, the digital Hall effect sensing devices are positioned at predetermined points along the stroke of the linear rod and communicate with an electronic signal processor during operation. As the Hall magnet (which is still attached to the free end of the piston rod) moves linearly past one of the digital Hall effect sensing devices, the digital Hall effect sensing device changes from an "on" state to an "off" state signaling the processor that a particular position has been reached. It should be noted in this regard that the accuracy of this (prior art) method is limited by the number of digital Hall effect sensing devices used. Obviously, increasing the number of digital Hall effect sensing devices would increase accuracy but would also increase the overall cost of the device which is undesirable from a manufacturing point of view. Therefore, using analog Hall effect sensing devices, which are much more accurate in terms of position sensing than digital Hall effect sensing devices, as in the novel set up, provides a reliable low cost alternative for manufacturers in need of integrated Hall position sensor solutions.

EXAMPLE 6

Figure 12:
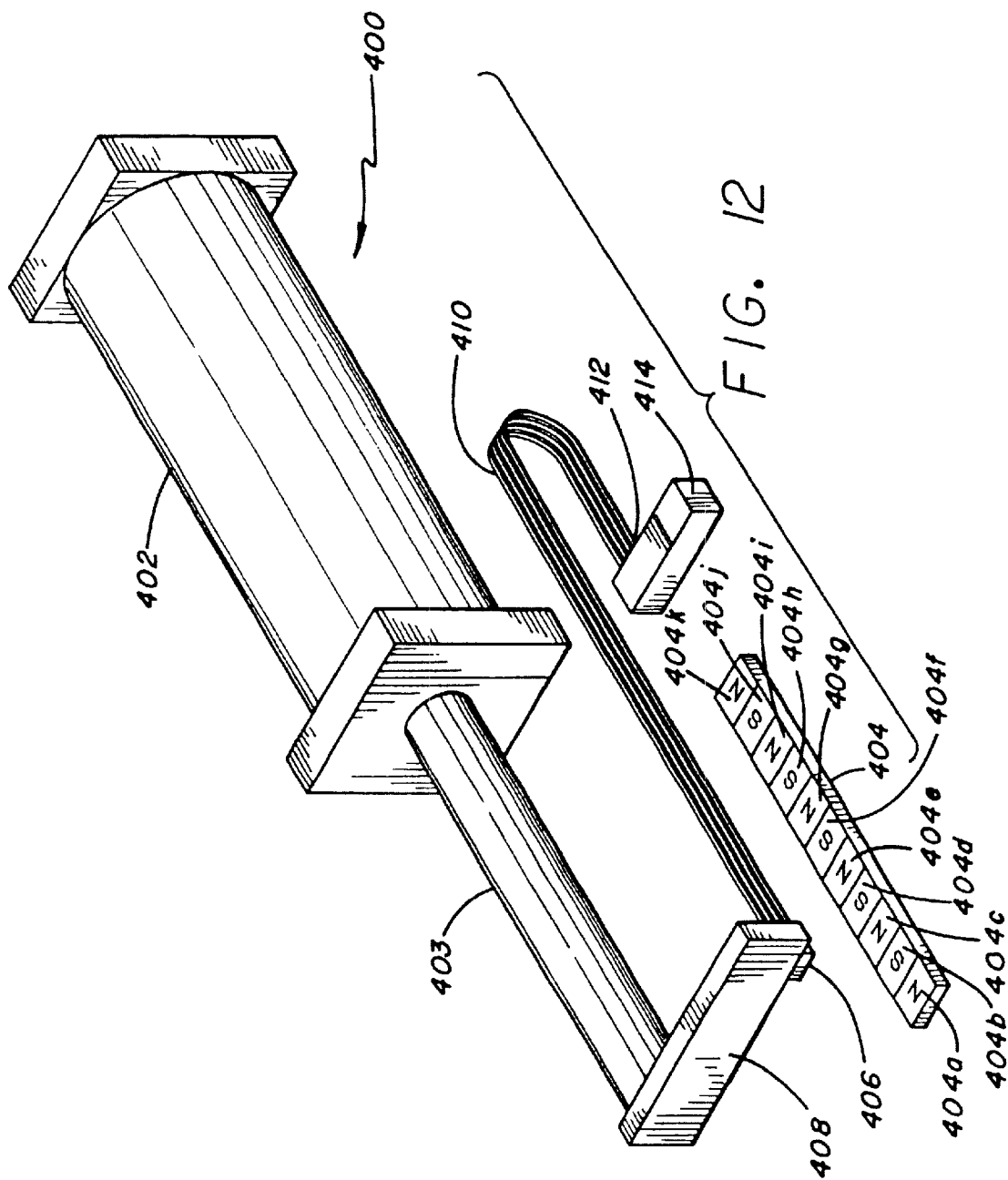
FIG. 12 is a perspective view of a Hall position sensor fabricated in accordance with the present invention as used in a linear actuator/servovalve sensor application.

FIG. 12 shows an alternative way to use the Hall position sensor of the present invention in position sensing applications involving a linear actuator such as a linear actuator 400. Linear actuator 400 comprises a hydraulic or pneumatic cylinder 402 attached to a servovalve (not shown), cylinder 402 having a piston rod 403. The servovalve controls fluid flow to the two ends of the cylinder causing piston rod 403 to move in or out respectively. The novel Hall position sensor comprises preferably a standard digital surface mount Hall effect sensing device 406 soldered via its three leads (not shown) in the manner described above directly to corresponding exposed copper traces (not shown) located at one end of a flexible circuit 410. Flexible circuit 410 also includes a stiffened end 412 having exposed copper conductors on one side for mating with a corresponding flexible circuit connector (not shown) be 7on an electronic processor 414 which converts the received feedback signals from Hall effect sensing device 406 into piston rod position measurements. Hall effect sensing device 406 is preferably affixed to the free end 408 of piston rod 403 and moves linearly back and forth with piston rod 403. The novel Hall position sensor also includes a fixed elongated magnetic strip 404 disposed parallel to piston rod 403 and proximate to Hall effect sensing device 406 to allow accurate position sensing during operation of the actuator. Magnetic strip 404 comprises a series of adjacent alternately magnetized sections 404a–404k, wherein 404a is a magnetized North pole, 404b is a magnetized South pole, 404c is a magnetized North pole, etc. This set up is a significant improvement over prior art methods which typically use a spiral cord or a cable having a retract mechanism to connect the dynamic Hall effect sensing device with the stationary processor. It is worth noting that the type of flexible circuit anticipated for use in this embodiment of the present invention would be a flexible circuit capable of high cycling and high frequency applications which eliminates normal wear and tear on conventional connectors thereby reducing maintenance costs and extending the life of the actuator.

Typical cost for a stationary flexible circuit of the type anticipated for use in Examples 2–5 when mass produced could be about $0.45 per unit while typical cost for a dynamic flexible circuit of the type anticipated for use in Example 6 when mass produced may be about $0.90 per unit, both types may be purchased from World Circuit Technology, Inc. of Simi Valley, Calif.

The above-described novel Hall position sensor can be constructed from low cost yet reliable components, is easy to assemble in a matter of seconds and provides reliable position sensing capability that can be used in a wide variety of applications. The soldered Hall effect sensing device/flexible circuit pair may be mass produced for a particular application as a single unit eliminating one of the traditional labor intensive physical connections as described hereinabove resulting in significant savings from a manufacturing point of view in labor, material and troubleshooting costs. The EMI advantages gained by using the novel Hall position sensor as mentioned above in Example 1 also apply to the applications described in Examples 2–5.

In accordance with a preferred embodiment of the present invention, a method for reducing the cost of integrating a Hall position sensor into a support structure adapted for receiving the same is disclosed. The Hall position sensor has at least one Hall magnet with the method comprising the steps of providing at least one low cost surface mount Hall effect sensing device with a plurality of electro-conductive leads; disposing the at least one surface mount Hall effect sensing device proximate to the at least one Hall magnet; providing a low cost flexible multiconductor circuit having first end portion and second end portion, each of the first and second end portions having exposed electrical conductors; providing a controller with a flexible circuit connector for mating with the first exposed electro-conductive end portion of the flexible circuit; plugging the first exposed electro-conductive end portion of the flexible circuit in the flexible circuit connector of the controller; and soldering the electro-conductive leads of the at least one surface mount Hall effect sensing device directly to the second exposed electro-conductive end portion of the flexible circuit.

In accordance with another preferred embodiment of the present invention, a method for reducing the cost of integrating a Hall position sensor into a support structure adapted for receiving the same is disclosed. The Hall position sensor has at least one Hall magnet with the method comprising the steps of providing at least one low cost through hole Hall effect sensing device with a plurality of electro-conductive leads; disposing the at least one through hole Hall effect sensing device proximate to the at least one Hall magnet; providing a low cost flexible multiconductor circuit having first end portion and second end portion, each of the first and second end portions having exposed electrical conductors; providing a controller with a flexible circuit connector for mating with the first exposed electro-conductive end portion of the flexible circuit; plugging the first exposed electro-conductive end portion of the flexible circuit in the flexible circuit connector of the controller; adjusting the length of the electro-conductive leads of the at least one through hole Hall effect sensing device to a length matching the width of the second exposed electro-conductive end portion of the flexible circuit; and soldering the adjusted electro-conductive leads of the at least one through hole Hall effect sensing device directly to the second exposed electro-conductive end portion of the flexible circuit.

While the present invention has been described in detail with regards to the preferred embodiments, it should be appreciated that various modifications and variations may be made in the present invention without departing from the scope or spirit of the invention. In this regard it is important to note that practicing the invention is not limited to the applications described above in Examples 1–6. The standard circuit used to connect the Hall effect sensing device to the controller in accordance with the general principles the present invention may have at least one flexible portion or may be a substantially flexible circuit depending on the application. Many other applications may be utilized provided such other applications do not depart from the intended purpose of the present invention. It should also be appreciated by a person skilled in the art that features illustrated or described as part of one embodiment can be used in another embodiment to provide yet another embodiment such that the features are not limited to the specific embodiments described above. Thus, it is intended that the present invention cover such modifications, embodiments and variations as long as such modifications, embodiments and variations fall within the scope of the appended claims and their equivalents.

What is claimed is:

1. A method of manufacturing a brushless motor including a stator and a rotor and a Hall magnet carried by said rotor and having a Hall sensor for detecting the position of said rotor, said method comprising the steps of:
   (a) providing at least one fully flexible circuit having first and second ends and including at least one electrical contact area containing exposed electrical conductors;
   (b) providing a surface mount Hall effect sensing device having a plurality of electro-conductive leads;
   (c) soldering said plurality of electro-conductive leads of said surface mount Hall effect sensing device directly to said exposed electrical conductors of said at least one fully flexible circuit;
   (d) operatively positioning said Hall effect sensing device on said stator adjacent said Hall magnet;
   (e) providing a controller for said motor; and
   (f) coupling said Hall effect sensing device to said controller with said fully flexible circuit.

2. A method of manufacturing a brushless motor as defined in claim 1 wherein said exposed electrical conductors are at said first end of said fully flexible circuit.

3. A method of manufacturing a brushless motor as defined in claim 2 wherein said second end of said fully flexible circuit is coupled to said controller.

4. A method of manufacturing a brushless motor as defined in claim 3 which includes the further step of adhesively securing said Hall effect sensing device and said fully flexible circuit to said motor adjacent said first end thereof.

5. A method of manufacturing a brushless motor as defined in claim 3 which includes the further step of positioning said controller remote from said motor.

* * * * *